(12) United States Patent
Seidel et al.

(10) Patent No.: US 9,478,602 B2
(45) Date of Patent: Oct. 25, 2016

(54) METHOD OF FORMING AN EMBEDDED METAL-INSULATOR-METAL (MIM) CAPACITOR

(71) Applicant: GLOBALFOUNDRIES Inc., Grand Cayman (KY)

(72) Inventors: Robert Seidel, Dresden (DE); Torsten Huisinga, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/507,927

(22) Filed: Oct. 7, 2014

(65) Prior Publication Data

US 2016/0099302 A1    Apr. 7, 2016

(51) Int. Cl.
    *H01L 49/02*    (2006.01)
(52) U.S. Cl.
    CPC ..................... *H01L 28/75* (2013.01)
(58) Field of Classification Search
    None
    See application file for complete search history.

(56) References Cited

U.S. PATENT DOCUMENTS

| 7,956,400 | B2 | 6/2011 | Smith |
| 2002/0192921 | A1* | 12/2002 | Hsue ............... H01L 21/76838 438/386 |
| 2003/0025143 | A1 | 2/2003 | Lin et al. |
| 2006/0237819 | A1* | 10/2006 | Kikuta et al. ............ 257/532 |
| 2007/0200162 | A1 | 8/2007 | Tu et al. |
| 2009/0200638 | A1* | 8/2009 | Smith ............. H01L 21/76816 257/532 |
| 2013/0065375 | A1* | 3/2013 | Lee et al. ................ 438/381 |

FOREIGN PATENT DOCUMENTS

TW    200807687 A    2/2008

OTHER PUBLICATIONS

Translation of Examination Report from the Intellectual Property Office for Taiwan Patent Application No. 104125574 dated Aug. 4, 2016.

* cited by examiner

*Primary Examiner* — Duy T Nguyen
*Assistant Examiner* — Bo Bin Jang
(74) *Attorney, Agent, or Firm* — Amerson Law Firm, PLLC

(57) ABSTRACT

A method of manufacturing a semiconductor device comprising a capacitor structure is provided, including the steps of forming a first metallization layer comprising a first dielectric layer and a first conductive layer functioning as a lower electrode for the capacitor structure over a semiconductor substrate, forming a barrier layer functioning as a capacitor insulator for the capacitor structure on the first metallization layer, forming a metal layer on the barrier layer and etching the metal layer to form an upper electrode of the capacitor structure.

7 Claims, 5 Drawing Sheets

METHOD OF FORMING AN EMBEDDED METAL-INSULATOR-METAL (MIM) CAPACITOR

BACKGROUND OF THE INVENTION

1. Field of the Invention

Generally, the present disclosure relates to the field of integrated circuits, and, in particular, to metal-insulator-metal capacitors.

2. Description of the Related Art

Integrated circuits typically include a large number of circuit elements, which form an electric circuit. In addition to active devices such as, for example, field effect transistors and/or bipolar transistors, integrated circuits can include passive devices such as resistors, inductors and/or capacitors.

As integration density of semiconductor devices increases, the area occupied by individual devices continues to shrink. Notwithstanding this, a capacitor for storing data of, for instance, a dynamic random access memory (DRAM) is required to have a sufficient capacitance, irrespective of the decrease in the area occupied by the capacitor. In addition to so-called native capacitors, which make use of the native or "parasitic" inter-metal capacity between metal lines in integrated circuits, there are metal-insulator-metal (MIM) capacitors. Accordingly, a metal-insulator-metal (MIM) capacitor, in which a lower electrode and an upper electrode are formed of metal and separated by a layer of insulating material, is being used in many integrated circuit products. Metal-insulator-metal capacitors can be used in CMOS, BICMOS and bipolar integrated circuits. Typical applications of metal-insulator-metal capacitors include filter and analog capacitors, for example, in analog-to-digital converters or digital-to-analog converters, decoupling capacitors, radio frequency coupling and radio frequency bypass capacitors in radio frequency oscillators, resonator circuits, and matching networks.

Additionally, MIM capacitors have been used extensively in semiconductor devices that perform analog-to-digital conversions and digital-to-analog conversions. Conversion between analog and digital signals requires that capacitors employed in such conversion be stable, i.e., the capacitance of the capacitors must be relatively stable over a range of applied voltages and temperatures. The capacitance of capacitors with polysilicon electrodes tends to be relatively unstable since the capacitor structures tend to vary with changes in temperature and applied voltage. Accordingly, capacitors with polysilicon electrodes are typically not used for such conversion applications. Metal-insulator-metal capacitors may be provided in additional interconnect levels, which are provided in addition to interconnect levels wherein electrically conductive lines connecting active circuit elements of integrated circuits such as, for example, transistors, are provided.

Key attributes of metal-insulator-metal capacitors may include a relatively high linearity over relatively broad voltage ranges, a relatively low series resistance, relatively good matching properties, relatively small temperature coefficients, relatively low leakage currents, a relatively high breakdown voltage and a sufficient dielectric reliability.

Techniques for forming metal-insulator-metal capacitors may include a deposition of a metal-insulator-metal stack on a planarized surface of a semiconductor structure and a patterning of the metal-insulator-metal stack. The metal-insulator-metal stack may include a bottom electrode layer, a dielectric layer and a top electrode layer. The metal-insulator-metal stack may be patterned by means of a photolithography process. However, the absorption and/or reflection of light by the metal-insulator-metal stack are largely depending on the materials used and the thicknesses of the layers in the metal-insulator-metal stack. Thus, there are limited material combinations that enable optical alignment through the metal-insulator-metal stack.

In forming the upper and lower metal electrodes of a MIM capacitor, an etching process is typically performed to pattern a metal layer. However, as the integration density of semiconductor devices continues to increase, it is becoming more difficult to etch such metal layers. In particular, copper, which has good electromigration resistance and a desirable low resistivity, may be difficult to etch. Accordingly, various methods for forming the upper and lower metal electrodes through a damascene process, that is, a process which does not involve etching a metal layer, have been proposed. A copper damascene process generally includes forming a trench for a copper structure in an insulation layer, forming a sufficient amount of copper to overfill the trench, and removing the excess copper from the substrate, thereby leaving the cooper structure in the trench. However, the damascene process used in forming copper-based capacitors and conductive lines and vias is time-consuming and expensive, and includes many steps, where chances for creating undesirable defects always exist.

Moreover, capacitors of the art suffer from the following problems. Vertical natural capacitors and finger metal-oxide-metal capacitors show insufficient capacitance due to low values of the dielectric constants of the used ultra-low-k dielectrics that, in principle, require large areas to provide significant capacitance anyway. The voltage of lateral capacitors, on the other hand, is limited, in principle, by the operation reliability of the employed ultra-low-k dielectrics. Moreover, conventional MIM capacitors in metallization/wire layers demand complex integration schemes.

Accordingly, there is a need for enhanced capacitor structures and formation processes, for example, for use in semiconductor device fabrication, which better integrate with conductive contact formation processing.

The present disclosure provides enhanced capacitor structures and manufacturing processes for the same wherein the above-mentioned issues may be properly addressed and the mentioned problems of the art may be overcome or at least alleviated.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method of manufacturing a semiconductor device including a capacitor structure disclosed herein includes the steps of forming over a semiconductor substrate a first metallization layer comprising a first dielectric layer and a first conductive layer functioning as a lower electrode for the capacitor structure, forming a barrier layer functioning as a capacitor insulator for the capacitor structure on the first metallization layer, forming a metal layer on the barrier layer and etching the metal layer to form an upper electrode of the capacitor structure.

According to another illustrative method of manufacturing a semiconductor device, the following steps are performed: forming a trench in a first dielectric layer of a metallization layer and filling the trench with a first metal layer to form a lower electrode of the MIM capacitor, forming a barrier layer of low-k material on the first metal layer and first dielectric layer to form a capacitor insulator of the MIM capacitor, forming a second metal layer on the barrier layer to form an upper electrode of the MIM capacitor, forming a second dielectric layer on the second metal layer, forming a via in the second dielectric layer stopping at the second metal layer and filling the via with a contact material.

Moreover, provided a method of forming a metal-insulator-metal (MIM) capacitor is provided including the steps of: forming a trench in a first dielectric layer of a metallization layer and filling the trench with a first metal layer to form a lower electrode of the MIM capacitor, forming a barrier layer of low-k material on the first metal layer and first dielectric layer to form a capacitor insulator of the MIM capacitor, forming a second metal layer on the barrier layer to form an upper electrode of the MIM capacitor, wherein the second metal layer has a larger lateral dimension in a lateral direction than the first metal layer, forming a second dielectric layer on the second metal layer, forming a via in the second dielectric layer extending through the upper electrode in a peripheric region of the upper electrode that does not overlap the first metal layer in the lateral direction and filling the via with a contact material.

Moreover, a semiconductor device is provided including a first metallization layer comprising a first dielectric layer and a first conductive layer, a low-k barrier layer formed on the first metallization layer, a second conductive layer formed on the low-k barrier layer, a second dielectric layer formed on the second conductive layer, a contact layer formed in the second dielectric layer and extending to the second conductive layer and a capacitor structure comprising the first conductive layer, the barrier layer and the second conductive layer.

Additionally, a semiconductor device is provided including a first metallization layer comprising a first dielectric layer and a first conductive layer, a low-k barrier layer formed on the first metallization layer, a second conductive layer formed on the low-k barrier layer and having a lateral dimension in a lateral direction larger than the lateral dimension of the first conductive layer in the lateral direction, a second dielectric layer formed on the second conductive layer, a contact layer formed in the second dielectric layer and extending through the second conductive layer in a peripheral region thereof that does not overlap the first conductive layer and a capacitor structure comprising the first conductive layer, the barrier layer and the second conductive layer.

According to the disclosed methods and semiconductor devices, a MIM capacitor is formed that comprises a first electrode in the form of a conductive layer comprised in a metallization or interconnect level layer and a second electrode formed directly on a relatively thin barrier layer that functions as the capacitor insulator and is formed directly on the metallization or interconnect level layer. Particularly, the metallization or interconnect level layer may comprise or consist of an ultra-low-k material and the barrier layer may comprise or consist of a low-k material with a low dielectric constant (k) that nevertheless is larger than the dielectric constant of the ultra-low-k material. For example, the dielectric constant of the low-k material may be chosen as $4<k<6$ and the dielectric constant of the ultra-low-k material may be chosen as $k<2.4$ or $k<2.3$ or $2.0<k<2.7$.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure provides methods for forming a MIM capacitor in a semiconductor structure comprising a metallization layer/interconnect level layer wherein the capacitor insulator of the capacitor is formed from a barrier layer formed on a surface of the metallization layer/interconnect level layer. An integrated circuit comprises a large number of semiconductor devices, such as transistors, that are formed on a semiconductor substrate. These devices are selectively interconnected by one or more patterned layers of a conductive material, for example, aluminum, to form a circuit that performs a desired function. These layers are referred to as metallization or interconnect level layers. The method may be employed in the framework of (Back-End-of-the-Line) BEOL processing, in particular, thin wire BEOL. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Further embodiments will be described with reference to the drawings. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 1A:
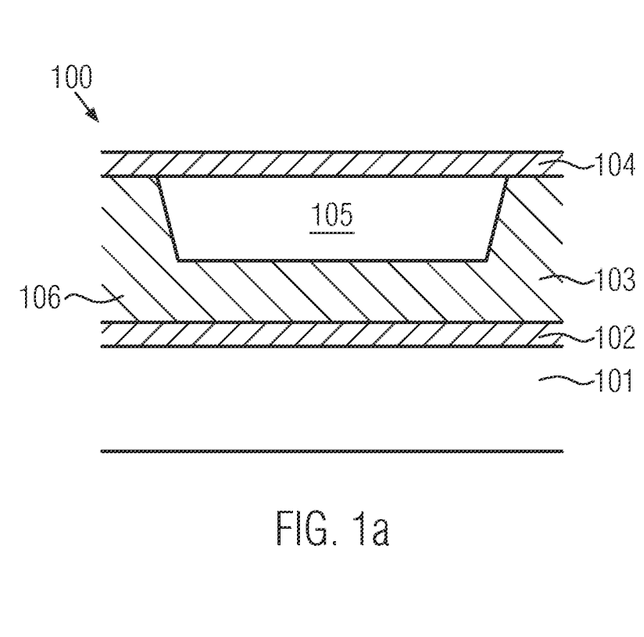
FIGS. 1a-1f show schematic cross-sectional views of a semiconductor structure in particular stages of a manufacturing method according to an example of the present disclosure.

FIG. 1a shows a semiconductor structure 100 representing an illustrative starting point for the disclosed method. The semiconductor structure 100 may include a substrate 101. In some embodiments, the substrate 101 may include a bulk semiconductor substrate formed of a semiconductor material, for example, a silicon wafer or silicon die. In other embodiments, the substrate 101 may include a semiconductor-on-insulator (SOI) substrate including a layer of a semiconductor material, for example, a silicon layer, that is formed above a support substrate, which may be a silicon wafer, and is separated therefrom by a layer of an electrically insulating material, for example, a silicon dioxide layer. The substrate 101 may comprise a semiconductor layer, which in turn may be comprised of any appropriate semiconductor material, such as silicon, silicon/germanium, silicon/carbon, other II-VI or III-V semiconductor compounds and the like.

The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. The semiconductor substrate 101 may be a silicon substrate, in particular, a single crystal silicon substrate. Other materials may be used to form the semiconductor substrate 101 such as, for example, germanium, silicon germanium, gallium phosphate, gallium arsenide, etc.

Furthermore, a plurality of circuit devices (not shown), for example, transistors and resistors, may be formed in and/or above the substrate 101. In particular, field effect transistors may be formed in and/or above the substrate 101. Each of the field effect transistors may have an active region including a source region, a drain region and a channel region that is formed in the semiconductor material of the substrate 101. Additionally, each of the field effect transistors may include a gate electrode formed above the channel region of the respective transistor, as well as a gate insulation layer provided between the gate electrode and the channel region. The gate insulation layer may provide electrical insulation between the gate electrode and the channel region. Further features of the field effect transistors may correspond to features of known field effect transistors. Moreover, a metallization layer (not shown) may be formed on the substrate 101.

Above the substrate 101 and sandwiched by a first low-k blocking layer 102 and a second low-k blocking layer 104, a metallization layer or interconnect level layer 103 may be formed. The metallization layer/interconnect level layer 103 serves for electrically contacting circuit elements formed in and on the substrate 101. In principle, the layer 103 may be any layer comprising a conductive layer (structure) 105 embedded in some dielectric layer 106. Usually, the metallization layer/interconnect level layer 103 comprises a plurality of conductive structures, in particular, electrically conducting contact structures. In the following, the layer 103 will be denoted metallization layer, for exemplary purposes.

The first and second low-k blocking layers 102 and 104 may particularly be provided for blocking undesired species diffusion of conductive materials (herein, the term "conductive" means electrically conductive) formed below the first low-k blocking layer 102 and in the second low-k blocking layer 104 and may have a dielectric constant k smaller than the dielectric constant of silicon, for example k<3, for example 4<k<6. However, the dielectric constant of the first low-k blocking layer 102 and the second low-k blocking layer 104 may be larger than the dielectric constant of the dielectric layer 106 of the metallization layer 103. The first and second low-k blocking layers 102 and 104 may comprise silicon nitride or silicon carbide, and inert atoms, for example, argon or krypton, may be incorporated in these layers. The first and second low-k blocking layers 102 and 104 may be layers of NBLoK™ with thicknesses of some 20-60 nm formed by a chemical vapor deposition process.

The metallization layer 103 may include an (interlayer) dielectric layer 106. The dielectric layer 106 may include an electrically insulating material, for example, silicon dioxide and/or silicon nitride. For example, the dielectric layer 106 may include fluorine-doped silicon dioxide, carbon-doped silicon dioxide, porous silicon dioxide, porous carbon-doped silicon dioxide, SiCOH, a polymeric dielectric such as polyimide, polynorbornenes, benzocyclobutene and/or polytetraflouroethylene, or a silicon-based polymeric dielectric, for example, hydrogen silsesquioxane and/or methylsilsesquioxane. In particular, the dielectric layer 106 may consist of or comprise an ultra-low-k (ULK) material with $2.0<k<2.7$. The dielectric layer 106 may be formed by chemical vapor deposition or a plasma enhanced version thereof and may have a thickness of some 100-500 nm, for example.

A planarization process, for example, a chemical mechanical polishing process, may be performed after the deposition of the dielectric layer 106 for obtaining a substantially planar surface. In the chemical mechanical polishing process, the surface of the semiconductor structure 100 is moved relative to a polishing pad while a slurry is supplied to an interface between the surface of the semiconductor structure 100 and the polishing pad. The slurry may react chemically with portions of the semiconductor structure 100 at the surface, and reaction products may be removed by friction between the semiconductor structure 100 and the polishing pad and/or by abrasion caused by abrasive particles in the slurry.

A conductive layer 105 is comprised in the metallization layer 103. The conductive layer 105 may include a metal, for example, copper and/or a copper alloy. The conductive layer 105 may be formed using a known damascene technique and may have a thickness of some 40-60 nm, for example. A diffusion barrier layer (not shown) may be provided between the conductive layer 105 and the dielectric layer 106. The diffusion barrier layer may be adapted for substantially avoiding a diffusion of metal from the conductive layer 105 into the dielectric layer 106. For example, the diffusion barrier layer may include one or more layers including titanium nitride, tantalum and/or tantalum nitride.

The formation of the conductive layer 105 may include forming a trench and, optionally, one or more contact vias in the dielectric layer 106. This may be done by means of techniques of photolithography and/or etching. The trench may be filled with the electrically conductive material of the conductive layer 105, for example, by means of electroplating. Thereafter, a chemical mechanical polishing process may be performed for removing portions of the material of the conductive layer 105 and/or a diffusion barrier layer, if provided, outside the trench. Thereafter, the second low-k blocking layer 104 may be deposited, for example, by means of chemical vapor deposition and/or plasma enhanced chemical vapor deposition.

Figure 1B:
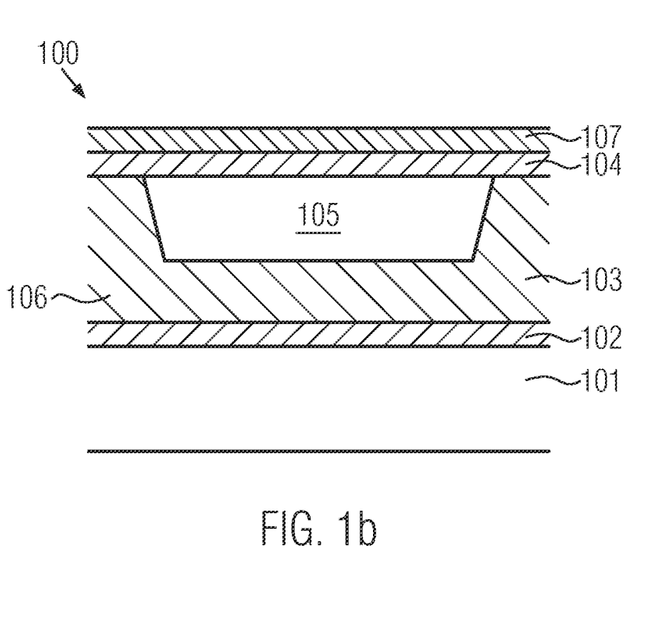

According to the present disclosure, the conductive layer 105 will operate as a lower electrode of a vertical capacitor and part of the second low-k barrier layer 104 will represent the capacitor insulator. In particular, the second low-k barrier layer 104 may be chosen to be significantly thinner than the metallization layer 103, for example, the thickness of the second low-k barrier layer 104 may be ⅓ or ¼ or ⅕ of the thickness of the metallization layer 103. As shown in FIG. 1b, a metal layer 107 comprising or consisting of a metal or metal compound is formed on the exposed surface of the second low-k barrier layer 104. The metal layer 107 may comprise or consist of titanium, titanium nitride, tantalum or tantalum nitride. The metal layer 107 may be deposited by means of a physical vapor deposition process, for example, sputtering, a chemical vapor deposition process or a plasma enhanced chemical vapor deposition process. The metal layer 107 may have a thickness in a range from about 10-250 nm, in particular, 30-60 nm.

Figure 1C:
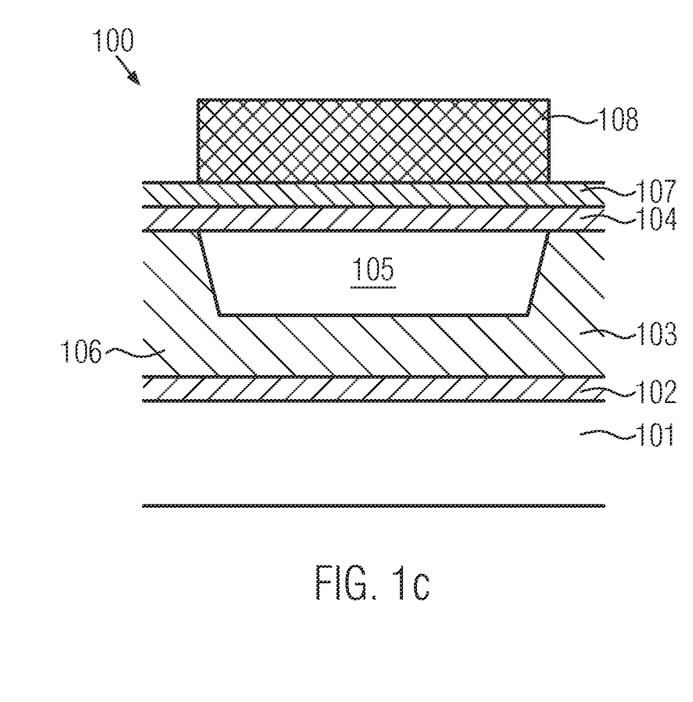
Figure 1D:
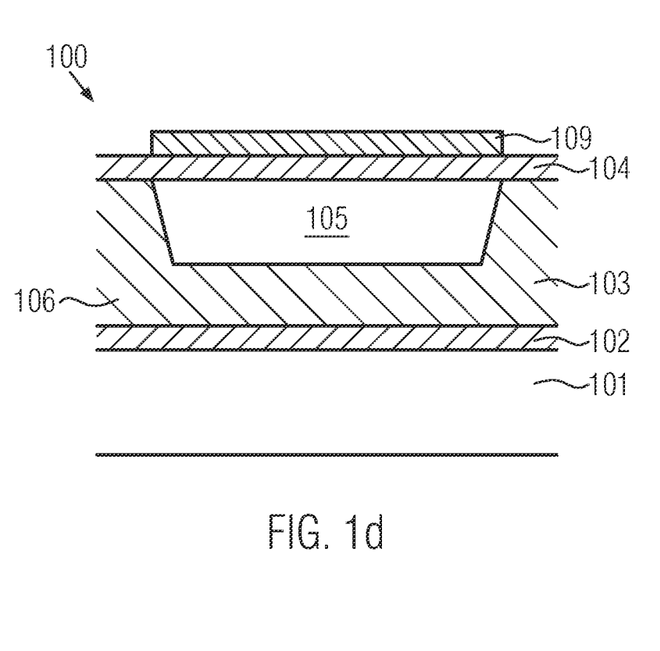

A mask 108 may be formed over the semiconductor structure 100, as shown in FIG. 1c. The mask 108 may be formed of a photoresist by means of techniques of photolithography. In the shown example, the mask 108 is patterned to cover a portion of the metal layer 107 without extending beyond the lateral edges of the conductive layer 105. By etching of the metal layer 107, an upper electrode 109 of the resulting capacitor structure is formed, as shown in FIG. 1d. The etching may be a dry (anisotropic) or wet etching process and the etching process may be followed by a wet cleaning process. In the wet cleaning process, the semiconductor structure 100 may be exposed to an amine-based resist stripper and/or tetramethyl ammonium hydroxide (TMAH). Due to the above-mentioned sizing of the mask 108, the upper electrode 109 has a lateral dimension in the direction from left to right in FIG. 1d that is almost equal to the lateral dimension of the conductive layer 105 in the same direction. In principle, a lateral dimension of the upper electrode 109 less than the one of the conductive layer 105 may, alternatively, be chosen by appropriately patterning the mask 108.

The mask 108 may be removed by means of a resist strip process, for example, a plasma resist strip process, wherein a plasma is created by a radio frequency discharge in a gas including oxygen.

Figure 1E:
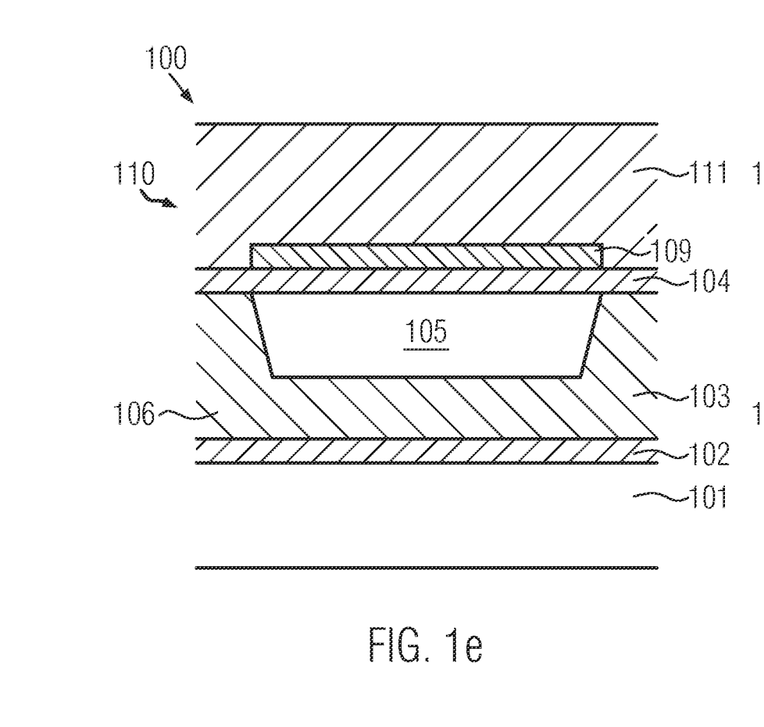
Figure 1F:
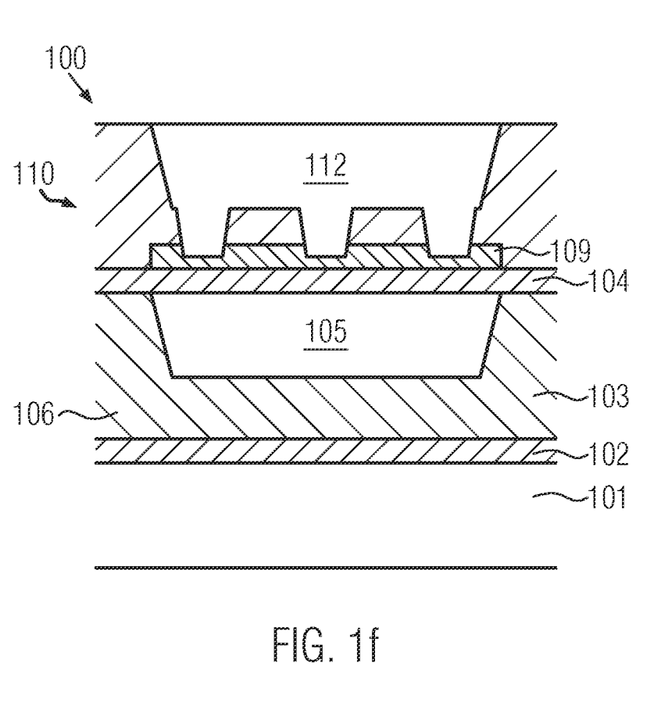

After formation of the capacitor structure comprising the lower electrode 105, the capacitor insulator in the form of the second low-k barrier layer 104 and the upper electrode 109, an additional metallization or interconnect level layer 110 may be formed, as shown in FIG. 1e. A dielectric layer 111 (an interlayer dielectric, for example) is deposited on the exposed surfaces of the upper electrode 109 and the second low-k blocking layer 104. Vias and trenches may be formed in the dielectric layer 111 and filled with metal-containing material 112, as shown in FIG. 1f. A via-first, trench-last technique may be employed wherein one or more vias are formed to the upper electrode 109 and subsequently trenches are formed in the dielectric material 111. Particularly, the upper electrode 109 is electrically connected by the metal-containing material 112 filled in vias landing on the upper surface of the upper electrode 109. The lower electrode 105 may also be electrically contacted within or through the metallization layer 103.

In order to guarantee via landing on the upper surface of the upper electrode 109, the via etching process of the dielectric layer 111 must be sufficiently selective with respect to the materials of the dielectric layer 111 and the upper electrode 109. In selective etching of a first material relative to a second material, an etch process is employed wherein an etch rate of the first material is substantially greater than an etch rate of the second material. The etch rate of a material may be expressed in terms of a thickness of a portion of a layer of the material that is removed per unit time when the material is exposed to an etchant used in the etch process, wherein the thickness is measured in a direction perpendicular to the surface of the layer of material. When etching vias in the dielectric layer 111, the upper electrode 109 functions as an etch stop layer in the example shown in FIG. 1f, i.e., the etching rate for the employed etching recipe of the dielectric layer 111 is much higher than the etching rate of the upper electrode 109. For example, the dielectric layer 111 may include silicon dioxide. Selective etching of silicon dioxide with respect to the material of the upper electrode 109 may be performed by means of a dry etch process wherein an etch gas containing carbon tetrafluoride ($CF_4$), a mixture of carbon tetrafluoride ($CF_4$) and oxygen ($O_2$) and/or a mixture of carbon tetrafluoride ($CF_4$) and hydrogen ($H_2$) is employed.

In the art, it is known to form a MIM capacitor in and above an interconnect level by using the ULK material of the dielectric layer 106 as a capacitor insulator. Contrary, in the present disclosure, the low-k barrier layer 104 is used as the capacitor insulator. Thereby, the capacitance may be increased due to the higher k-value of the low-k barrier layer as compared to the ULK material. Moreover, the thickness of the low-k barrier layer 104 is lower than the thickness of the dielectric layer 106, thereby also increasing the capacitance of the capacitor structure comprising the lower electrode 105, capacitor insulator 104 and upper electrode 109. In addition, the low-k barrier layer 104 functioning as the capacitor insulator shows superior dielectric properties as compared to ULK material with respect to density and robustness against process-related damages. Spontaneous electrostatic discharge may be reliably avoided when choosing a typical material for the second low-k barrier layer 104, for example, silicon nitride or silicon carbide, and inert atoms, for example, argon or krypton, as the capacitor insulator.

As already mentioned, the formation of vias in the dielectric material 111 and, thus, the electrical contacting of the upper electrode 109 demands selectivity of the dielectric material 111 and the material of the upper electrode 109 with respect to the etching process to be carried out in order to form the vias. In the following, another example of a method of forming a capacitor structure is described that is suitable when there is insufficient selectivity of the dielectric etch to the upper electrode. Etching and layer formation processes may be similar to the ones described with reference to FIGS. 1a-1f. Moreover, materials and thicknesses of the corresponding layers may be chosen similarly.

Figure 2A:
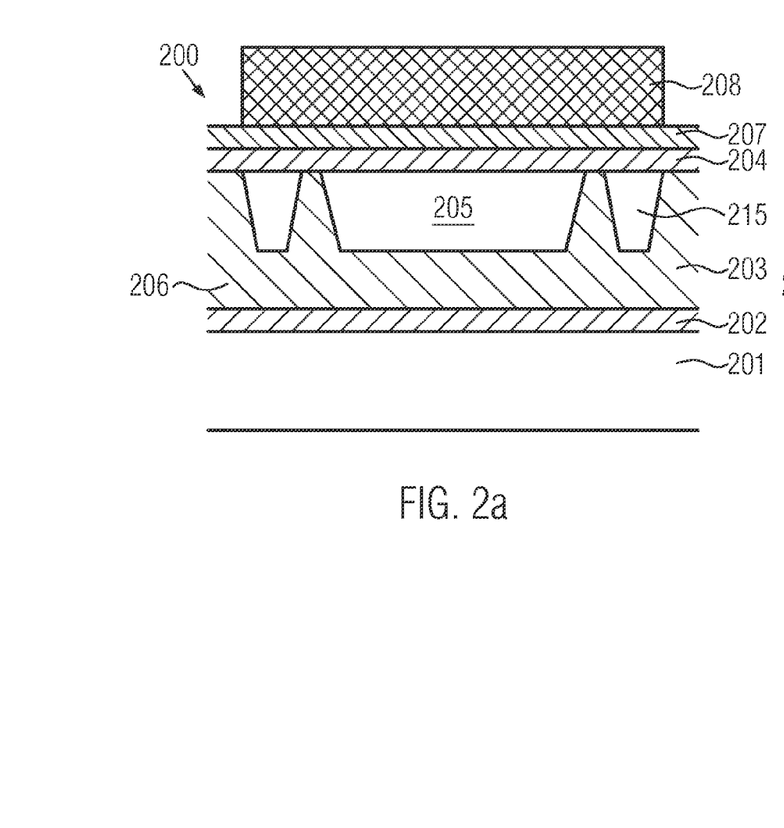
FIGS. 2a-2d show schematic cross-sectional views of a semiconductor structure in particular stages of a manufacturing method according to another example of the present disclosure.

FIG. 2a shows a semiconductor structure 200 similar to the one shown in FIG. 1c. The semiconductor structure 200 comprises a substrate 201 that may be similar to the substrate 101 described above. Over the substrate 201, a first low-k barrier layer 202, a metallization/interconnect level layer 203 and a second low-k barrier layer 204 are formed. The first and second low-k barrier layer 202 and 204 may be similar to the first and second low-k barrier layers 102 and 104 that are shown in FIGS. 1a-1f. The metallization layer 203 may be similar to the one shown in FIGS. 1a-1f. The second low-k barrier layer 204 may be chosen to be significantly thinner than the metallization layer 203, for example, the thickness of the second low-k barrier layer 204 may be ⅓ or ¼ or ⅕ of the thickness of the metallization layer 203. Particularly, the metallization layer 203 may comprise a conductive layer 205 comprising multiple conductive structures and a dielectric layer 206 that, in particular, may comprise or consist of a ULK dielectric material, for example, with k<2.4. The conductive layer 205 and the dielectric layer 206 may be made of the same material as the conductive layer 105 and dielectric layer 106 shown in FIGS. 1a-1f. Atop of the second low-k barrier layer 204, a metal layer 207 comprising or consisting of a metal or metal compound similar to the metal layer 107 of FIGS. 1b-1f is formed.

Figure 2B:
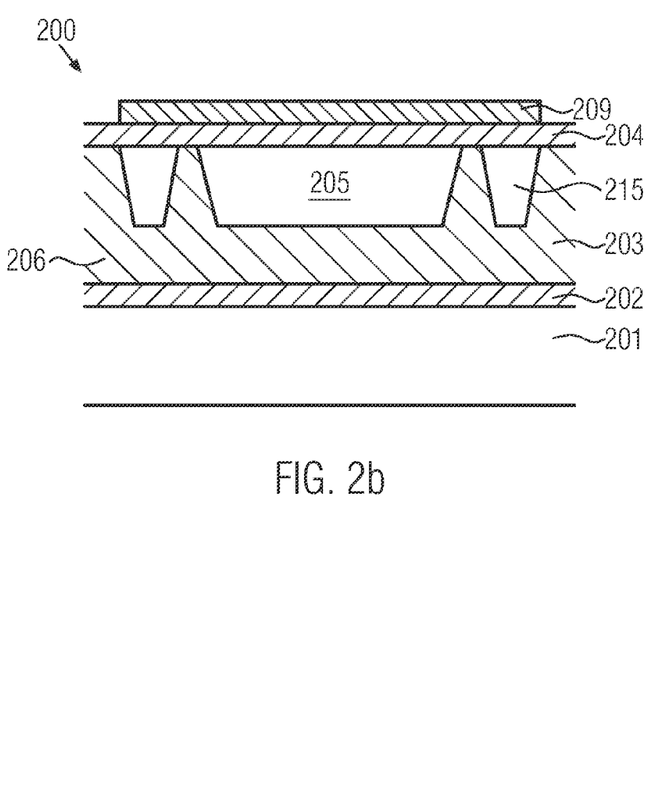

The metal layer 207 has to be patterned in order to form an upper electrode of a capacitor structure. In the example shown in FIG. 2a, mask 208, for example, a photoresist mask, is formed on the metal layer 207. Different from the example illustrated in FIG. 1c, the mask 208 is formed such that it significantly extends laterally over the lateral edges of the conductive layer 205 that shall function as a lower electrode for the capacitor structure. In the shown example, the mask at least partially covers the additional conductive structures 215 at the left and right of the central conductive structure that shall form the lower electrode of the capacitor. After the steps of etching the metal layer 207, wet cleaning and resist stripping, the structure shown in FIG. 2b results. The upper electrode 209 clearly extends beyond the lateral edges of the lower electrode 205 (in the direction from left to right in the figures) and may at least partially overlap the additional conductive structures 215 at the left and right of the central conductive structure.

Figure 2C:
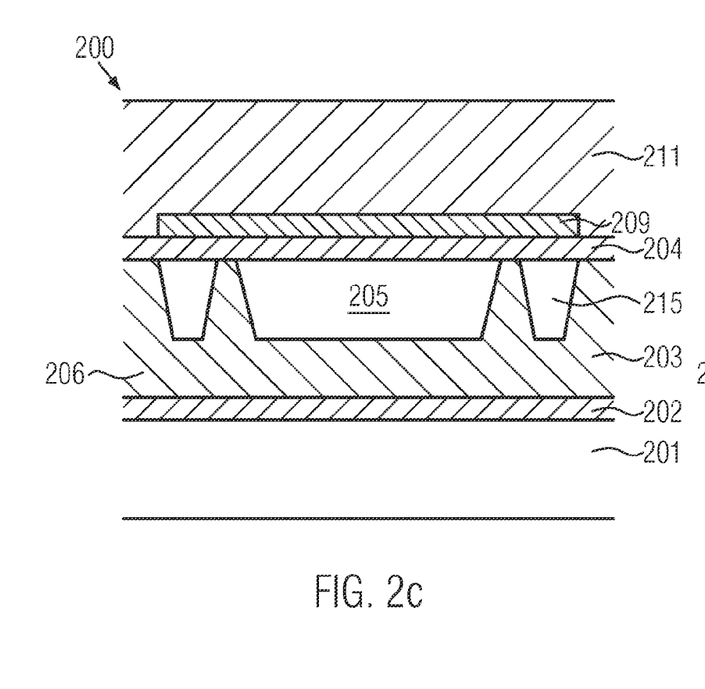

FIG. 2c shows a further developed stage of the manufacturing procedure. A dielectric layer 211 similar to dielectric layer 111 shown in FIGS. 1e and 1f is formed on the exposed surfaces of the upper electrode 209 and second low-k barrier layer 204. The dielectric layer 211 may be formed as part of another metallization/interconnect level layer comprising a plurality of conductive structures. Moreover, a further layer may be formed on the dielectric layer 211 wherein the further layer may comprise conductive structures and/or semiconductor devices, for example, resistors or capacitors or memory cells or logic components of an electric circuit.

Figure 2D:
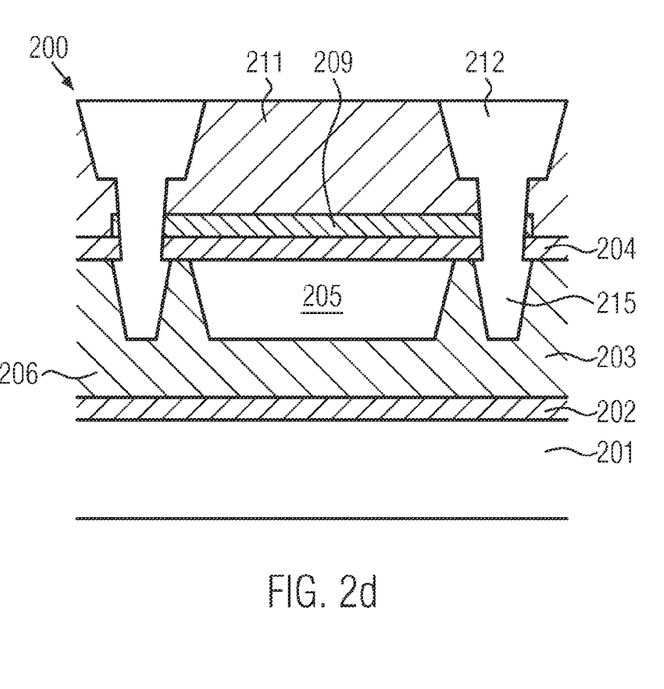

By means of an appropriately patterned (photoresist) mask, the dielectric layer 211 is etched in order to form vias and trenches that are subsequently filled with a contact material 212, as shown in FIG. 2d. In the shown example, no significant selectivity with respect to etching is given for the dielectric material 211 and the material of the upper electrode 209, i.e., the upper electrode 209 cannot function as an etch stop layer in the etching process carried out for forming vias. In fact, in the shown example, etching goes through the material of the upper electrode 209 and opens the underlying second low-k barrier layer 204.

Etching of the vias stops at the additional conductive structures 215 embedded in the (ULK) dielectric material 206, i.e., the additional conductive structures 215 function as landing dummies. It is noted that provision of the additional conductive structures 215 is merely optional and, alternatively, they may be omitted or replaced by non-conductive structures. However, the upper electrode 209 is contacted by the contact material 212 at the outer peripheries spaced apart from the lateral edges of the lower electrode 205, thereby avoiding short-circuiting of the lower and upper electrodes 205 and 209 of the capacitor structure comprising the lower and upper electrodes 205 and 209 and the capacitor insulator in the form of the second low-k barrier layer 204.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method of manufacturing a semiconductor device comprising a capacitor structure, comprising:
    forming a first metallization layer comprising a first dielectric layer and a first conductive layer functioning as a lower electrode for said capacitor structure over a semiconductor substrate;
    forming a conductive structure in said first dielectric layer of said first metallization layer;
    forming a barrier layer functioning as a capacitor insulator for said capacitor structure on said first metallization layer;
    forming a metal layer on said barrier layer;
    etching said metal layer to form an upper electrode of said capacitor structure and to expose portions of said barrier layer, said upper electrode being contiguous and vertically aligned with said lower electrode, wherein said first conductive layer has a first lateral dimension in a lateral direction and said metal layer is etched such that said upper electrode has a second lateral dimension in said lateral direction that is larger than said first lateral dimension of said first conductive layer;
    forming a second dielectric layer on said etched metal layer and said exposed portions of said barrier layer;
    etching said second dielectric layer to form a via extending through said upper electrode in a peripheric region of said upper electrode that does not overlap said first conductive layer in said lateral direction and exposing said conductive structure; and
    filling said via with a contact material, said contact material in said via contacting said upper electrode and said conductive structure.

2. The method of claim 1, wherein said upper electrode functions as an etch stop layer during said etching of said second dielectric layer.

3. The method of claim 1, wherein said first dielectric layer is made of an ultra-low-k material and said barrier layer is made of a low-k material with a dielectric constant higher than the dielectric constant of said ultra-low-k material.

4. The method of claim 1, wherein a thickness of said barrier layer is at most ⅓ of a thickness of said first metallization layer.

5. A method of forming a metal-insulator-metal (MIM) capacitor, comprising:

forming a trench in a first dielectric layer of a metallization layer and filling said trench with a first metal layer to form a lower electrode of said MIM capacitor;

forming a barrier layer of low-k material on said first metal layer and said first dielectric layer to form a capacitor insulator of said MIM capacitor;

forming a second metal layer on said barrier layer to form an upper electrode of said MIM capacitor, wherein said second metal layer has a larger lateral dimension in a lateral direction than said first metal layer, said upper electrode being contiguous and vertically aligned with said lower electrode;

forming a second dielectric layer on said second metal layer;

forming a via in said second dielectric layer extending through said upper electrode in a peripheric region of said upper electrode that does not overlap said first metal layer in said lateral direction;

filling said via with a contact material; and forming a conductive structure in said first dielectric layer of said metallization layer, said conductive structure functioning as a landing site for said formed via and said contact material filled into said via.

6. The method of claim 5, wherein said first dielectric layer comprises or consists of an ultra-low-k material with a dielectric constant lower than a dielectric constant of said barrier layer.

7. The method of claim 5, wherein a thickness of said barrier layer is at most ⅓ of a thickness of said first dielectric layer.

* * * * *